Dec. 10, 1968 F. W. KRUSE, JR., ET AL 3,416,100
VOLTAGE TUNED OSCILLATOR WITH RESISTIVE AND CAPACITIVE TUNING DIODES
Filed April 7, 1967
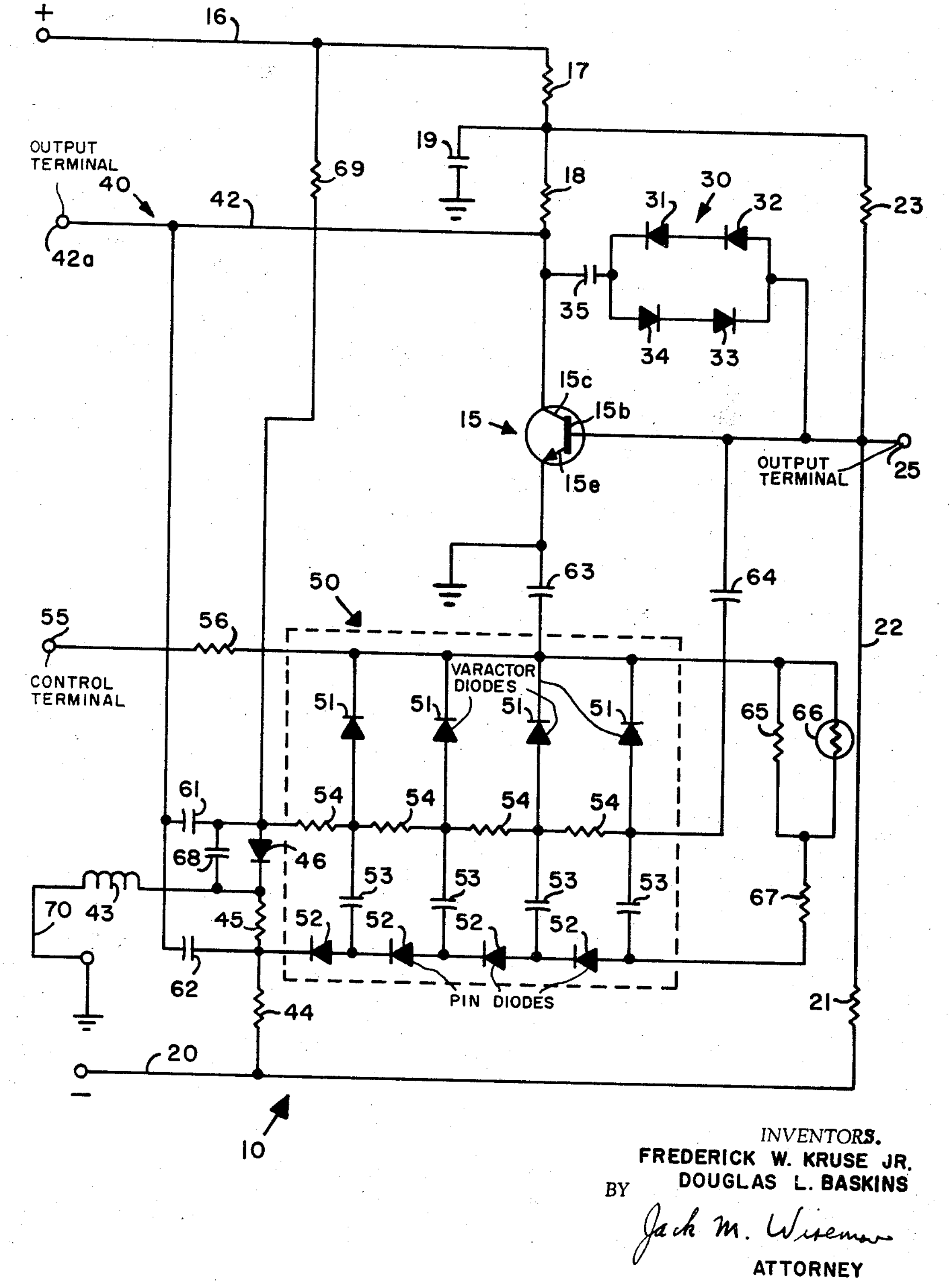
INVENTORS.
FREDERICK W. KRUSE JR.
DOUGLAS L. BASKINS
BY
Jack M. Wiseman
ATTORNEY United States Patent Office 3,416,100
Patented Dec. 10, 1968

3,416,100

VOLTAGE TUNED OSCILLATOR WITH RESISTIVE AND CAPACITIVE TUNING DIODES

Frederick W. Kruse, Jr., Palo Alto, and Douglas L. Baskins, Cupertino, Calif., assignors to Kruse-Storke Electronics, Mountain View, Calif., a corporation of California Filed Apr. 7, 1967, Ser. No. 629,163
17 Claims. (Cl. 331—108)

ABSTRACT OF THE DISCLOSURE

An oscillator including an amplifier with a feedback loop containing a voltage controlled phase shift circuit. The phase shift circuit comprises variable capacitance diodes in the form of varactors and variable resistance diodes in the form of PIN diodes. By controlling the voltage applied to the variable capacitance diodes and by controlling the current flow through the variable resistance diodes, the phase shift of the phase shift circuit is adjusted for selecting the oscillating frequency of the voltage tuned oscillator.

The present invention relates in general to resistance-capacitance tuned oscillators, and more particularly to a voltage-current tuned phase shift oscillator.

An object of the present invention is to provide a phase shift oscillator that is electrically tuned.

Another object of the present invention is to provide a phase shift oscillator with an extremely wide tuning range in excess of a decade.

Another object of the present invention is to provide an oscillator that is electrically tuned by varying the current flow through a variable resistance element.

Another object of the present invention is to provide an oscillator which is electrically tuned by controlling the voltage applied to a variable capacitance element and the current flow through a variable resistance element.

Another object of the present invention is to provide an oscillator which is electrically tuned by simultaneously controlling the voltage applied to a variable capacitance element and the current flow through a variable resistance element.

Briefly, the oscillator of the present invention selects the oscillating frequency by electrically controlling variable capacitance diodes and variable resistance diodes of the phase shift network in the feedback loop of the oscillator. This is accomplished by either controlling the current flow through the variable resistance diodes or the voltage applied to the variable capacitance diodes or both.

Other and further objects and advantages of the present invention will be apparent to one skilled in the art from the following description taken in conjunction with the accompanying drawing, in which:

The single figure is a schematic diagram of the voltage-current tuned oscillator of the present invention.

Illustrated in the single figure of the present invention is the voltage-current tuned oscillator 10 of the present invention which comprises a transistor 15 having a base electrode **15*b*, a collector electrode 15*c* and an emitter electrode 15*e*. A positive direct current is applied to the collector electrode 15*c* of the transistor 15 over a path including conductor 16, resistor 17 and resistor 18. A negative direct current is applied to the base electrode 15*b* of the transistor 15 over the following path: conductor 20, resistor 21 and conductor 22. A resistor 23 is connected to the base electrode 15*b* of the transistor 15 to provide a positive direct current through the resistor 17 over the conductor 16. The resistors 17, 21 and 23 serve as a negative feedback bias network for the transistor 15. The resistor 18 is employed as the collector A.C. load and a capacitor 19** is employed as an A.C. by-pass for the oscillator signals.

For controlling the gain or for limiting the amplitude of the output signal of the oscillator 10, a limiting network 30 is interconnected between the collector electrode **15*c* and the base electrode 15*b* of the transistor 15. The limiting network 30 includes diodes 31–34 and a D.C. blocking capacitor 35**.

A feedback network 40, which includes a conductor 42, is connected at one end thereof to the collector electrode **15*c* of the transistor 15. Also included in the feedback network 40 is a four-stage, voltage and current variable, R-C phase shift network 50. Each stage of the R-C phase shift network 50 comprises a variable reactance, such as a variable capacitance device or Varactor diode 51; a variable resistance device, such as a PIN diode 52; a D.C. blocking capacitor 53; and a shunt resistor 54. Each PIN diode 52** has a zone of intrinsic conductivity between the p and n terminal regions.

A control voltage for the phase shift network 50 is applied at a terminal 55, which is in series with a damping resistor 56. The D.C. biasing voltages of the transistor 15 are blocked from the phase shift network 50 by means of blocking capacitors 61 and 62, which are in series with the feedback network 40, and by means of blocking capacitors 63 and 64, which are connected in series with the emitter **15*e* and the base 15*b***, respectively.

An inductance coil 43 sets the D.C. potential for the phase shift network 50. The bias for the PIN diodes 52 is set by resistors 44 and 45 through the inductance coil 43 and the bias for the variable capacitance diodes 51 is obtained through the resistors 54, and voltage drop across a diode 46, and the inductance coil 43. The D.C. voltage on the conductor 16 is applied to the bias potential reference at the junction of the diode 46, and resistors 54 through a diode current setting resistor 69. A capacitor 68 is the A.C. by-pass across the diode 46. The D.C. potential on the conductor 20 is conducted to the diodes 52 through the resistor 44. Reference D-C potentials for the phase shift network 50 are, therefore, obtained from the conductor 16 by way of the current setting resistor 69 and from the conductor 20 through the resistors 44 and 45.

Connected in series with the control terminal 55 is a current-limiting resistance network comprising parallel-connected resistor 65 and thermistor 66. The thermistor 66 and the resistor 65, which are in series with a resistor 67, is a temperature compensating network for the PIN diodes 52. The diode 46 is a temperature compensating device for the Varactor diodes 51.

The transistor 15 functions as a common-emitter transistor amplifier. The output is coupled to the input over the feedback path comprising the coupling capacitors 61 and 62, the phase-shift network 50, and the coupling capacitor 64. The oscillator 10 will oscillate at the frequency $f$ for which there is a 360° net phase shift in the path from the base **15*b* to the collector 15*c* through the feedback network 40, which includes the phase shift network 50, and back to base 15*b***. Other amplifiers configurations can be used and, as is well known from the theory of R-C phase-shift oscillators, the circuit will, in general, oscillate at that frequency for which there is a 360° net phase shift around the closed loop consisting of the amplifier and the feedback network.

In the exemplary embodiment of the present invention, the R and C of the phase shift circuit 50 are simultaneously and electrically changed in the same sense in order to provide rapid and wide range changes in the oscillation frequency as is required, for example, in frequency-modulated applications. This is accomplished by the application of a voltage at terminal 55 which simultaneously establishes a reverse D-C bias across varactor diodes 51 and a series DC current through the PIN diodes 52. As is well known, the capacitance of the variable capacitance diodes 51 decreases with reverse-bias voltage and the resistance of the variable resistance PIN diodes 52 decreases with increasing series current, so that an accumulative effect is obtained by simultaneously varying said reverse-bias and said series current. It is understood, however, that either the R or the C may be varied electrically to select the oscillating frequency.

In operation, the oscillator circuit 10 oscillates with no voltage applied to the terminal 55 at a reference frequency at which there is a 360° net phase shift around the loop of the amplifier transistor 15 and the feedback network 40 in combination. Upon application of a voltage at the control terminal 55, which is positive with respect to ground, the varactor diodes 51 become reverse-biased and the series current through PIN diodes 52 is determined by the voltage difference between the terminal 55 and the junction of resistors 44 and 45. As the voltage at the terminal 55 is increased in the positive direction, the reverse bias across the varactor diodes 51 in creases, whereby the capacitance of these diodes decreases, and, also the current through the PIN diodes 52 increases, whereby the resistance of the diodes 52 decreases. This simultaneous decrease in R and C results in an increased oscillation frequency *f*. Thus, by applying a suitable voltage and/or modulating signals to the control terminal 55, the oscillation frequency of the circuit can be varied as desired. The low level distortion output for the oscillator 10 may be obtained from a terminal 25. High level output signals may be obtained from a terminal 42*a* on the conductor 42. A jumper 70 is removed from ground and connected to a controlling source when narrow tuning or phase lock is desired.

In a typical embodiment of the circuit shown in the drawing, the transistor amplifier 15 is type 2N3960, the varactor diodes 51 are type 1N5148, the diode 46 is type 1N4446, the PIN diodes 52 are type D5720B, a positive voltage of 20 volts is applied to line 16, and a negative voltage of 20 volts is applied to line 20. In this embodiment, the oscillation frequency is varied from 10 mHz. to 110 mHz. as the voltage applied to terminal 55 is varied from 0 to +60 volts.

While reference is made herein to a voltage tuned oscillator, it is to be understood that the electrical tuning may be accomplished by varying the current or varying the voltage or both.

It is to be understood that modifications and variations of the embodiments of the invention disclosed herein may be resorted to without departing from the spirit of the invention and scope of the appended claims.

Having thus described our invention, what we claim as new and desire to protect by Letters Patent is:

1. An oscillator circuit comprising: an amplifier; and a phase shift feedback network interconnecting the input and output of said amplifier, said phase shift network comprising an electrically variable reactance and an electrically variable resistance connected so that the application of a control voltage to said network simultaneously changes said reactance to produce a phase shift change in a given direction and changes said resistance to produce a phase shift change in the same direction, said reactance being a variable capacitance diode and said resistance being a variable resistance diode, and the application of the voltage to said phase-shift network causes the reverse-bias across said variable capacitance diode and the current through said variable resistance diode to vary simultaneously.

2. An oscillator circuit as claimed in claim 1 wherein said variable resistance diode is a PIN diode.

3. An oscillator as claimed in claim 1 wherein said variable capacitance diode is a varactor diode.

4. An oscillator as claimed in claim 2, wherein said variable capacitance diode is a varactor diode.

5. An oscillator circuit comprising: an amplifier; and an R-C phase-shift feedback network interconnecting the input and output of said amplifier, said phase-shift network comprises a plurality of phase-shift sections, each of said sections comprises an electrically variable capacitor and an electrically variable resistor, said capacitor being a variable capacitance diode and said resistor being a variable resistance diode.

6. An oscillator circuit as claimed in claim 5 wherein said variable capacitance diode is a varactor diode.

7. An oscillator circuit as claimed in claim 5 wherein said variable resistance diode is a PIN diode.

8. An oscillator circuit as claimed in claim 7, wherein said variable capacitance diode is a varactor diode.

9. An oscillator circuit according to claim 5 wherein said variable capacitance diode and said variable resistance diode are connected in a circuit such that the application of a control voltage to said circuit increases the reverse-bias across said variable capacitance diode while simultaneously increasing the current through said variable resistance diode.

10. An oscillator circuit comprising: an amplifier; and an R-C phase-shift feedback network interconnecting the input and output of said amplifier, said phase shift network comprising a plurality of phase-shift sections, each of said sections comprising an electrically variable capacitor and an electrically variable resistor, said capacitor being a variable capacitance diode and said resistor being a variable resistance diode, said variable capacitance diode and said variable resistance diode being connected in a circuit such that the application of a control voltage to said circuit increases the reverse-bias across said variable capacitance diode while simultaneously increasing the current through said variable resistance diode, a current-limiting resistance network in series with said variable resistance diode, said resistance network comprising resistors of opposite temperature coefficients of resistance, whereby the resistance of said variable resistance diode is maintained substantially independent of temperature.

11. An oscillator circuit comprising an amplifier; and an R-C phase-shift feedback network interconnecting the input and output of said amplifier, said phase shift network comprising a plurality of phase-shift sections, each of said sections comprising an electrically variable capacitor and an electrically variable resistor, said capacitor being a variable capacitance diode and said resistor being a variable resistance diode, said variable capacitance diode and said variable resistance diode being connected in a circuit such that the application of a control voltage to said circuit increases the reverse-bias across said variable capacitance diode while simultaneously increasing the current through said variable resistance diode, a temperature-compensating diode connected to said variable capacitance diode, whereby said temperature-compensating diode substantially compensates for changes in capacitance resulting from changes in the variable capacitance diode temperature.

12. An oscillator circuit comprising an amplifier, a frequency selecting feedback network connected to said amplifier for selecting the output frequency thereof, said frequency selecting network including an electrically variable resistance device, and means connected to said frequency selecting network for controlling said variable resistance device to select the output frequency of said oscillator; said variable resistance device being a variable resistance diode, said frequency selecting network also includes a variable capacitance diode, said means controls said variable capacitance diode while controlling said variable resistance diode to select the output frequency of said oscillator.

13. An oscillator circuit as claimed in claim 12 wherein said variable capacitance diode is a varactor diode.

14. An oscillator circuit as claimed in claim 12 wherein said variable resistance diode is a PIN diode.

15. An oscillator circuit as claimed in claim 14 wherein said variable capacitance diode is a varactor diode.

16. An oscillator as claimed in claim 12 wherein said means simultaneously controls the voltage across said variable capacitance diode and the current flow through said variable resistance diode to select the output frequency of said amplifier.

17. An oscillator circuit as claimed in claim 12 wherein said frequency selecting network is a phase shift network, and variations in current flow through said varible resistance diode and variations in voltage across said variable capacitance diode produces variations in phase shift in said phase shift network.

References Cited

UNITED STATES PATENTS 2,816,228 12/1957 Johnson ........... 331—108

FOREIGN PATENTS 680,304 2/1964 Canada.

OTHER REFERENCES

Lupu, "A Simple FM Subcarrier Oscillator Suitable for Physiological Telemetry," Proceedings of the IEEE, November 1963, pp. 1621, 1622.

Uno, "Varistor Network Controls Voltage-Tuned Oscillator," Electronics, July 28, 1961, pp. 44–47.

ROY LAKE, *Primary Examiner.*

SIEGFRIED H. GRIMM, *Assistant Examiner.*

U.S. Cl. X.R.

331—137, 140, 177; 332—30; 333—70